United States Patent
Wu et al.

(10) Patent No.: US 7,842,543 B2
(45) Date of Patent: Nov. 30, 2010

(54) WAFER LEVEL CHIP SCALE PACKAGE AND METHOD OF LASER MARKING THE SAME

(75) Inventors: Ruisheng Wu, Shanghai (CN); Yan Liu, Shanghai (CN); Tao Feng, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 75 days.

(21) Appl. No.: 12/378,713

(22) Filed: Feb. 17, 2009

(65) Prior Publication Data

US 2010/0207283 A1   Aug. 19, 2010

(51) Int. Cl.
*H01L 21/50*   (2006.01)

(52) U.S. Cl. ....................................................... 438/106

(58) Field of Classification Search ........................ None
See application file for complete search history.

(56) References Cited

U.S. PATENT DOCUMENTS

| | | | | |
|---|---|---|---|---|
| 5,268,065 A * | 12/1993 | Grupen-Shemansky | ..... | 438/118 |
| 5,610,104 A * | 3/1997 | Mitchell | ..... | 428/428 |
| 6,023,094 A * | 2/2000 | Kao et al. | ..... | 257/632 |
| 6,248,973 B1 * | 6/2001 | Matsumura et al. | ..... | 219/121.69 |
| 6,261,919 B1 * | 7/2001 | Omizo | ..... | 438/401 |
| 6,273,099 B1 * | 8/2001 | Chang et al. | ..... | 134/1.3 |
| 6,374,834 B1 * | 4/2002 | Abe et al. | ..... | 134/1.3 |
| 6,448,632 B1 * | 9/2002 | Takiar et al. | ..... | 257/659 |
| 6,596,965 B2 * | 7/2003 | Jeong et al. | ..... | 219/121.68 |
| 6,683,637 B2 * | 1/2004 | Corbett | ..... | 347/224 |
| 6,984,876 B2 * | 1/2006 | Kime et al. | ..... | 257/659 |
| 7,238,543 B2 * | 7/2007 | Tandy et al. | ..... | 438/26 |

* cited by examiner

*Primary Examiner*—Scott B Geyer
(74) *Attorney, Agent, or Firm*—Jingming Cai; Schein & Cai LLP

(57) ABSTRACT

A wafer level chip scale package and method of laser marking the same are disclosed. The method includes forming a plurality of semiconductor devices on a frontside surface of a wafer, metallizing device contacts on the frontside surface of the wafer, grinding the backside surface of the wafer, silicon etching the backside surface of the wafer, laser marking the backside surface of the wafer following the silicon etch step, oxide etching the backside surface of the wafer following the laser marking step, depositing a metal layer on the backside surface of the wafer following the oxide etch step, and dicing the wafer into wafer level chip scale packages. A wafer level chip scale package includes a mark formed on a backside surface thereof, the mark comprising a plurality of trenches formed in a silicon backside surface and corresponding indentations formed in an overlaying back metal layer.

6 Claims, 3 Drawing Sheets

WAFER LEVEL CHIP SCALE PACKAGE AND METHOD OF LASER MARKING THE SAME

BACKGROUND OF THE INVENTION

1. Field of the Invention

The present invention generally relates to a method of providing identification marks on a surface of a semiconductor package and more particularly to a wafer level chip scale package and a method of laser marking the same.

2. Description of the Related Art

Product information (such as part number, pin 1 location and identifying logo) is conventionally provided by means of a mark on the unbumped surface of a chip scale package (CSP). For CSPs manufactured using wafer level packaging technology, such marks are typically formed by either ink or laser marking the back surface of the wafer.

An example of ink marking is disclosed in U.S. Patent Application Publication No. 2004/0188860. A chip scale package includes an ink mark printed and cured on the backside surface of the CSP. While this method is "non-destructive" in the sense that no damage is done to the backside surface, ink marks are not durable and may be damaged in subsequent handling of the CSP, particularly if the ink mark is printed on a smooth surface.

Laser marking provides a durable mark and the identification mark may be formed directly on the silicon of the backside surface or indirectly on a layer formed or applied over the silicon of the backside surface. Examples of direct marks are disclosed in U.S. Pat. Nos. 6,248,973, 6,261,919, 6,374,834, and 6,596,965. Examples of indirect marks are disclosed in U.S. Pat. Nos. 5,610,104, 6,023,094, 6,683,637, and 7,238,543.

Known laser marking techniques are not well suited for wafer-level CSPs having a back metal such as power MOSFETs, and more particularly, common drain MOSFETs used in battery protection applications. Direct marking of such MOSFET backside surfaces cuts through the back metal, adversely affecting lateral current flow through the back metal and increasing the resistance thereof.

Indirect marking on a coating or film applied to the MOSFET backside surface does not have these adverse effects upon the electrical performance of the chip. However, the resulting sandwich structure (Si/metal/organic film) of the backside surface leads to micro-chipping during dicing of the wafer due to the different mechanical properties of the components of the sandwich structure. Additionally, applying the coating or film adds to the cost of the wafer level CSP manufacturing process. Other approaches require special equipment, or require thick wafers for convenient handling and are not suitable for thin wafers.

In view of the limitations of the prior art, there is a need in the art for a method of laser marking a wafer level CSP having a back metal.

SUMMARY OF THE INVENTION

The method of laser marking a wafer level CSP having a back metal of the invention overcomes the disadvantages of the prior art by providing a continuous, undamaged back metal layer. Back metallization of the wafer follows laser marking of the bare silicon wafer backside surface to ensure continuity of the back metal layer.

In accordance with one aspect of the invention, a wafer level CSP includes a laser mark formed on a backside surface thereof, the laser mark being formed by trenches in a silicon wafer backside surface and corresponding indentations formed in an overlaying back metal layer.

In accordance with another aspect of the invention, a method of laser marking a wafer level CSP includes the steps of forming a plurality of semiconductor devices on a frontside surface of a wafer, metallizing device contacts on the frontside surface of the wafer, grinding the backside surface of the wafer, silicon etching the backside surface of the wafer, laser marking the backside surface of the wafer following the silicon etch step, oxide etching the backside surface of the wafer following the silicon etch step, depositing a metal layer on the backside surface of the wafer following the oxide etch step, and dicing the wafer into wafer level chip scale packages.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of functional components and to the arrangements of these components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF A PREFERRED EMBODIMENT OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Figure 1:
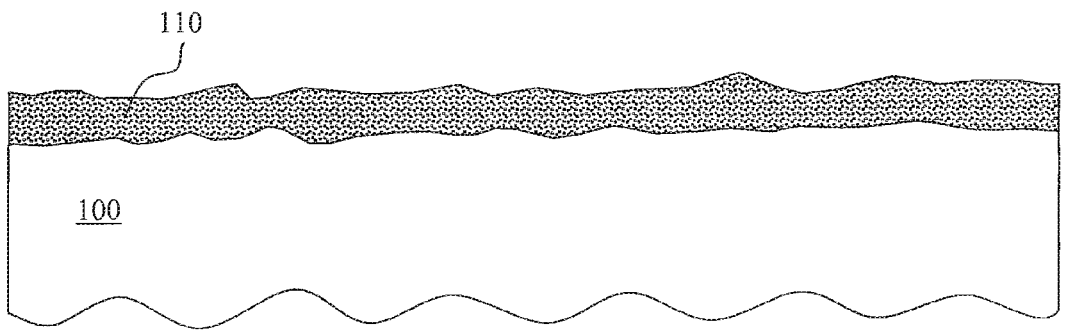
FIG. 1 is a schematic representation of a wafer backside surface following a grinding operation in accordance with the invention.
Figure 5:
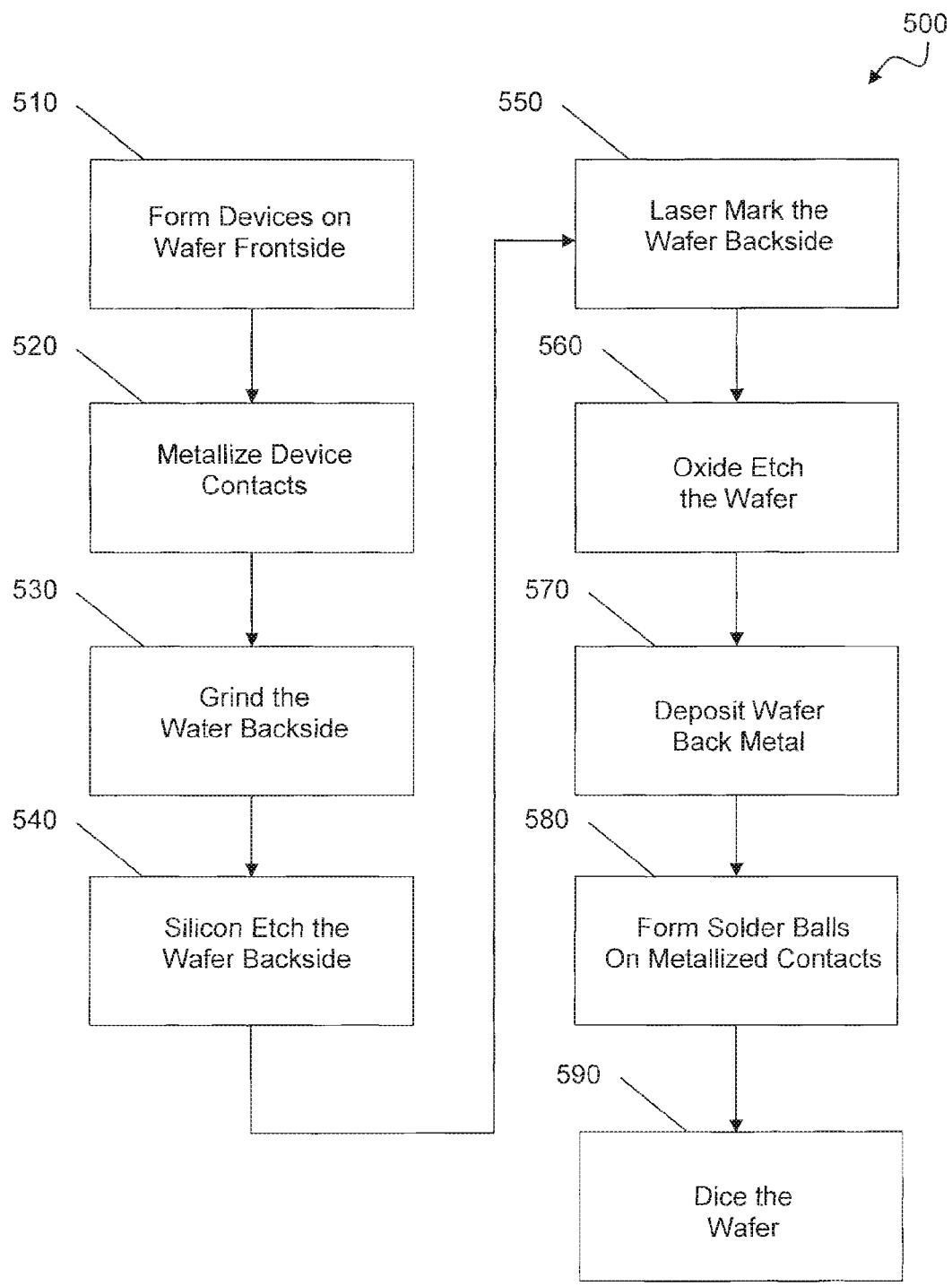
FIG. 5 is a flow chart illustrating methods steps in accordance with the invention.

With reference to FIG. 5, a method generally designated 500 for laser marking a wafer level chip scale package includes a step 510 in which a plurality of semiconductor devices are formed on a frontside surface of a wafer 100 (FIG. 1). Contacts of the devices formed on the wafer frontside surface are metallized in a step 520. In a step 530 the backside surface of the wafer is mechanically ground. As a result of the grinding operation, a layer of damaged silicon 110 is formed on the backside surface as shown in FIG. 1.

Figure 2:
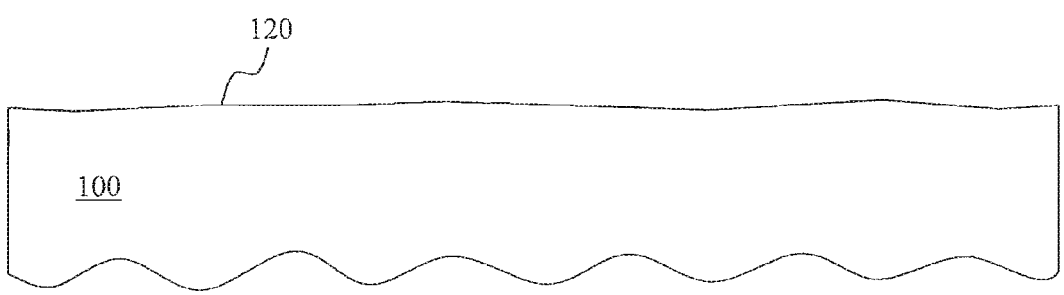
FIG. 2 is a schematic representation of the wafer backside surface following a silicon etch operation in accordance with the invention.
Figure 3:
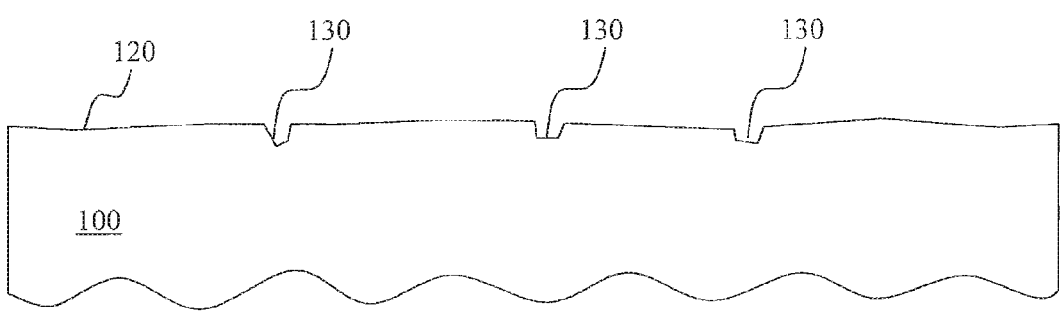
FIG. 3 is a schematic representation of the wafer backside surface following a laser marking operation in accordance with the invention.

The backside surface of the wafer 100 is next etched in a step 540 to remove the damaged silicon layer 110 in a silicon etch operation. A substantially smooth backside surface 120 is thereby provided as shown in FIG. 2. Following the silicon etch operation, the backside surface 120 of the wafer 100 is laser marked in a step 550. Laser marking results in a plurality of trenches 130 being formed in the backside surface 120 as shown in FIG. 3. An oxide etch operation is performed next in a step 560 to remove silicon oxides from the backside surface 120 of the wafer 100 prior to the deposition of a metal layer 140 (FIG. 4) on the backside surface 120 in a step 570. Solder balls are optionally formed on the metalized device contacts in an optional step 580. In a step 590 the wafer 100 is diced into individual chip scale packages.

Figure 4:
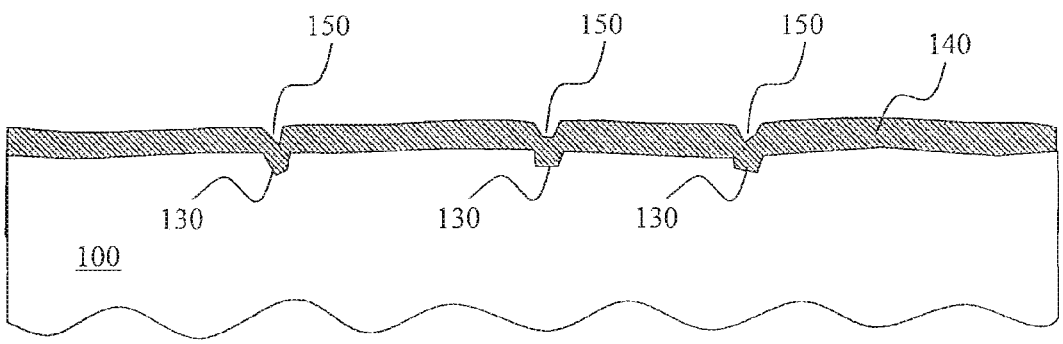
FIG. 4 is a schematic representation of the wafer backside surface following a back metal deposition operation in accordance with the invention.
Figure 6:
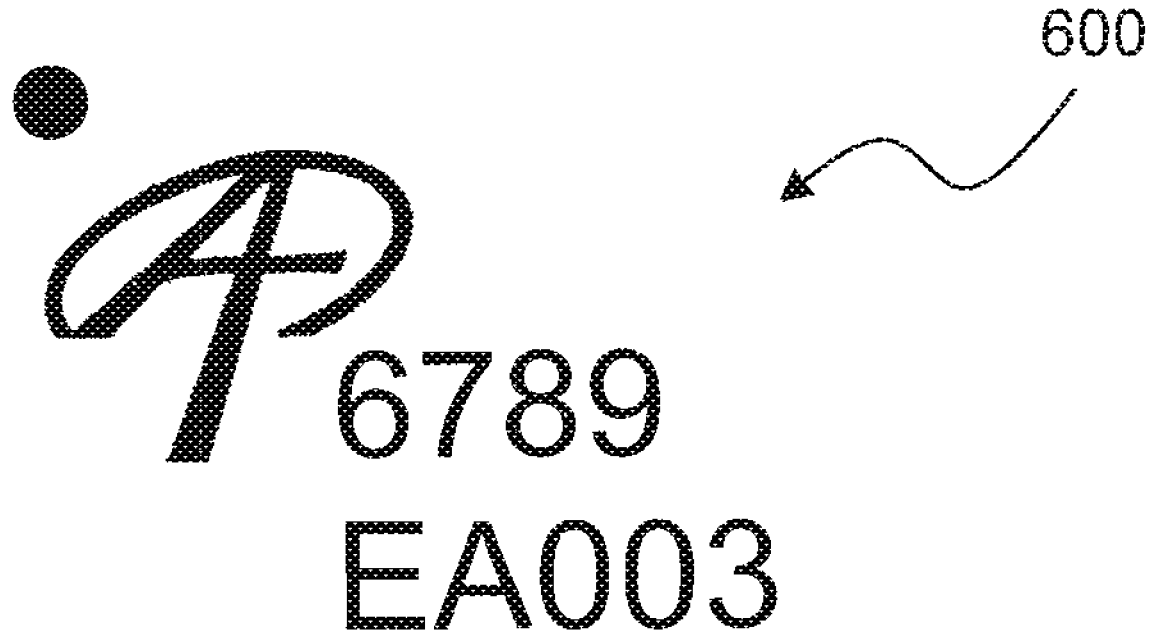
FIG. 6 is a partial plan view of a wafer backside surface showing laser markings in accordance with the invention.

As shown in FIG. 4, the trenches 130 formed in the backside surface 120 of the wafer 100 provide for indentations 150 in the back metal layer 140 following the deposition step 570. The back metal layer 140 is continuous and of generally uniform thickness to ensure later current flow therethrough. Visual contrast between the metal in the indentations 150 and the rest of the metal of the layer 140 provides for markings capable of identifying the marked wafer level chip scale packages. Mark 600 formed in accordance with the method 500 is shown in FIG. 6. By way of example, the laser mark can include such information as a company logo, part number, batch number, and pin one location.

A wafer level chip scale package in accordance with the invention includes the laser mark 600 formed by trenches 130 in the silicon wafer backside surface 120 and corresponding indentations 150 formed in the overlaying back metal layer 140.

Typical thicknesses of wafers for power MOSFET manufacture are 200 um and preferably less than 300 um. Total back metal thicknesses range from 0.5 um to 10 um and are preferably about 2.5 um. The composition of the back metal layer may include a multilayered structure of Ti/Ni/Ag/Ni, Ti/Ni/Ag, Ti/Au, Ti/Ni/Au, Ti/Al, or Ti/Al/Ni/Au. The electrical resistance of MOSFET wafer level chip scale packages may be reduced by providing thinner wafers having relatively thick back metal layers. Notwithstanding the specification of typical and preferred thicknesses, one skilled in the art will recognize that the wafer level chip scale package and method of laser marking the same in accordance with the invention can be practiced with wafers of any thickness.

It has been discovered by the inventors that the silicon etch step 540 must be performed before the laser marking step 550. Otherwise serious particle contamination of the device backside surface results with the concomitant risk of peeling of the metal layer from the backside surface. In experiments where the silicon etch step 540 was performed after rather than before the laser marking step 550, even megasonic cleaning techniques were ineffective in solving the particle contamination problem. No cleaning techniques were required when the silicon etch step 540 was performed before the laser marking step 550 other than an oxide etch and particle contamination was minimized.

The wafer level chip scale package and method of laser marking the same of the invention provides a chip scale package having a continuous back metal layer. Back metallization of the wafer follows laser marking of the bare silicon wafer backside surface to ensure continuity of the back metal layer.

It is apparent that the above embodiments may be altered in many ways without departing from the scope of the invention. Further, various aspects of a particular embodiment may contain patentably subject matter without regard to other aspects of the same embodiment. Still further, various aspects of different embodiments can be combined together. Accordingly, the scope of the invention should be determined by the following claims and their legal equivalents.

We claim:

1. A method of laser marking a wafer level chip scale package comprising the steps of:
   (a) forming a plurality of semiconductor devices on a frontside surface of a wafer;
   (b) metallizing device contacts on the frontside surface of the wafer;
   (c) grinding the backside surface of the wafer;
   (d) silicon etching the backside surface of the wafer;
   (e) laser marking the backside surface of the wafer following step (d);
   (f) oxide etching the backside surface of the wafer following step (e);
   (g) depositing a metal layer on the backside surface of the wafer following step (f); and
   (h) dicing the wafer into wafer level chip scale packages.

2. The method of claim 1, wherein the wafer level chip scale package comprises a power MOSFET.

3. The method of claim 1, wherein the wafer level chip scale package comprises a common drain power MOSFET.

4. The method of claim 1, further comprising forming solder balls on the metallized device contacts following step (g).

5. A method of laser marking a wafer level chip scale package with minimal micro-particle contamination comprising the steps of:
   (a) forming a plurality of semiconductor devices on a frontside surface of a wafer;
   (b) metallizing device contacts on the frontside surface of the wafer;
   (c) grinding the backside surface of the wafer;
   (d) silicon etching the backside surface of the wafer;
   (e) laser marking the backside surface of the wafer following step (d);
   (f) oxide etching the backside surface of the wafer following step (e);
   (g) depositing a metal layer on the backside surface of the wafer following step (f); and
   (h) dicing the wafer into wafer level chip scale packages.

6. The method of claim 5, further comprising forming solder balls on the metallized device contacts following step (g).

* * * * *